(12) United States Patent
Den Besten

(10) Patent No.: US 6,842,073 B2
(45) Date of Patent: Jan. 11, 2005

(54) ELECTRONIC CIRCUIT COMPRISING AN AMPLIFIER FOR AMPLIFYING A BINARY SIGNAL

(75) Inventor: Gerrit W. Den Besten, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/484,352
(22) PCT Filed: Jul. 25, 2002
(86) PCT No.: PCT/IB02/03143

§ 371 (c)(1),
(2), (4) Date: Jan. 20, 2004

(87) PCT Pub. No.: WO03/010882

PCT Pub. Date: Feb. 6, 2003

(65) Prior Publication Data

US 2004/0183600 A1 Sep. 23, 2004

(30) Foreign Application Priority Data

Jul. 25, 2001 (EP) .......................................... 01202847

(51) Int. Cl.[7] ................................................ H03F 3/45
(52) U.S. Cl. .................... 330/261; 330/127; 330/259; 330/297; 327/52; 327/54; 327/57
(58) Field of Search ................................. 330/261, 259, 330/127, 296, 297; 327/563, 52, 54, 57

(56) References Cited

U.S. PATENT DOCUMENTS 6,535,026 B2 * 3/2003 Chung et al. .................. 327/51

* cited by examiner

Primary Examiner—Michael B Shingleton
(74) Attorney, Agent, or Firm—Aaron Waxler

(57) ABSTRACT

An electronic circuit comprising an amplifier (AMP) for amplifying a binary input signal ($U_i$) including an input stage coupled to receive the binary input signal ($U_i$) comprising means for supplying a DC current to the input stage. The means supplies a current having a first ($I_1$) current value to the input stage during a period of time that is approximately equal to the period of time corresponding to a transition phase from a first binary signal value to a second binary signal value. During the remaining time, the means supplies a current having a second ($I_2$) current value which is smaller than the first ($I_1$) current value. By virtue thereof, the electronic circuit only consumes a significant amount of power during a transition phase from the first binary signal value to the second binary signal value. The amplifier (AMP) can be implemented in all kinds of digital circuits, of which the digital voltage range (the difference between the second and the first binary values) must be increased. For example, in oscillators that supply many clock phases, a substantial saving in power can be obtained by applying said amplifier (AMP) instead of prior-art amplifiers.

4 Claims, 2 Drawing Sheets

ELECTRONIC CIRCUIT COMPRISING AN AMPLIFIER FOR AMPLIFYING A BINARY SIGNAL

Figure 1:
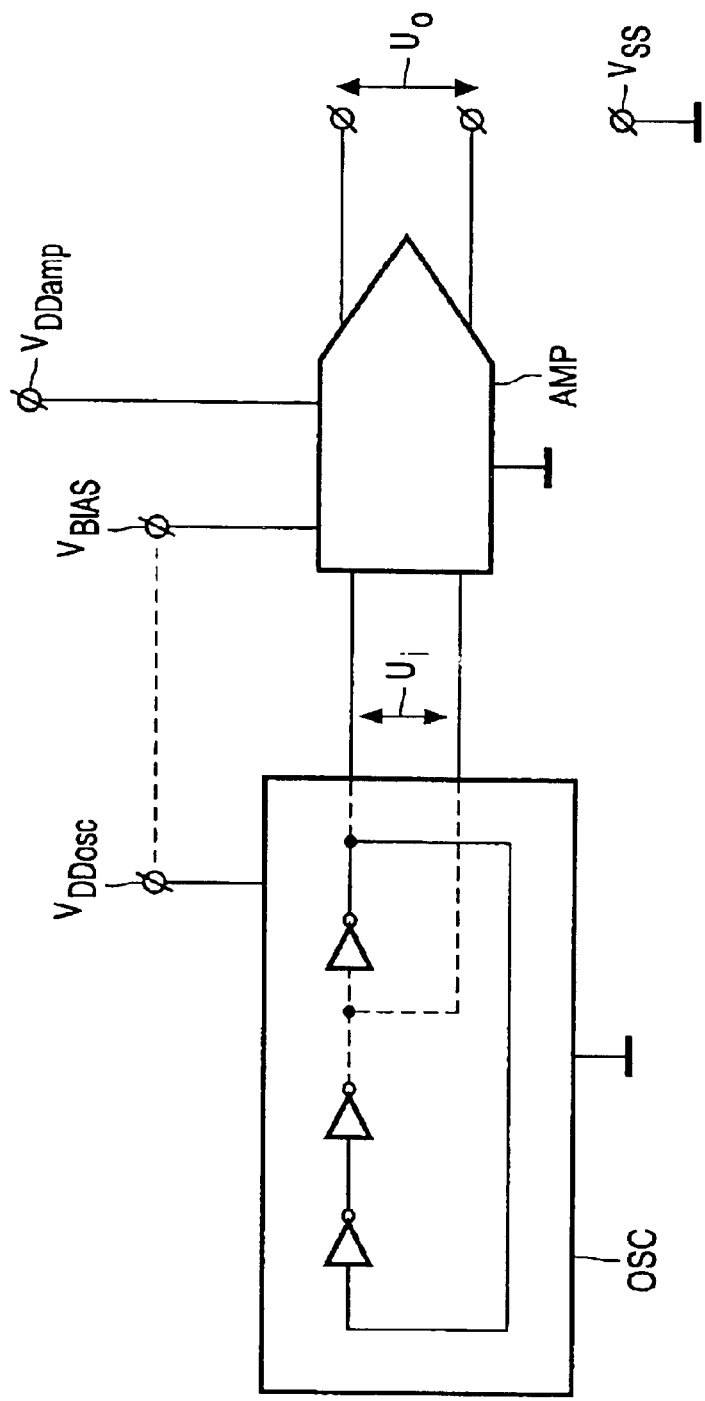

The invention relates to an electronic circuit comprising an amplifier for amplifying a binary input signal comprising an input stage coupled to receive the binary input signal comprising current means for providing a current setting of the input stage.

Such an electronic circuit is known from the general state of the art. In order to amplify comparatively small signals, the amplifier comprises an analog input circuit.

A drawback of the known circuits resides in that they consume comparatively much current.

Therefore it is an object of the invention to provide an electronic circuit with an amplifier for amplifying binary signals, which electronic circuit consumes less current.

This object is achieved, in accordance with the invention, by the electronic circuit mentioned in the opening paragraph, which is characterized in that during a period of time which is approximately equal to the duration of a transition phase from a first binary signal level to a second binary signal level of the binary input signal, the current means supplies a current having a first current intensity to the input stage, and that, during the remaining period of time, the current has a second current intensity which is small in relation to the first current intensity.

The invention is based on the recognition that the information in a binary signal, which frequently is a digital signal (although it may also be a time-continuous binary signal), only contains information in the signal edges, i.e. during the above-mentioned transition phase. This is the reason why only during this transition phase comparatively much current is needed for the (analog) input stage of the amplifier. The current intensity during the transition phase is referred to as the first current intensity, while outside this transition phase the current intensity is referred to as the second current intensity. It is possible for said second current intensity to be zero, however, if a high information transfer per unit of time is needed, it may be necessary to choose this second current intensity to be larger than zero, yet said second current intensity is always comparatively small in relation to the first current intensity.

The electronic circuit in accordance with the invention can be used for all kinds of applications. The amplifiers in accordance with the invention can particularly advantageously be used as decoupling circuits for polyphase oscillators because they enable a substantial saving in current to be attained.

Advantageous embodiments of the invention are specified in claims 2, 3 and 4.

These and other aspects of the invention are apparent from and will be elucidated with reference to the embodiments described hereinafter.

Figure 2:
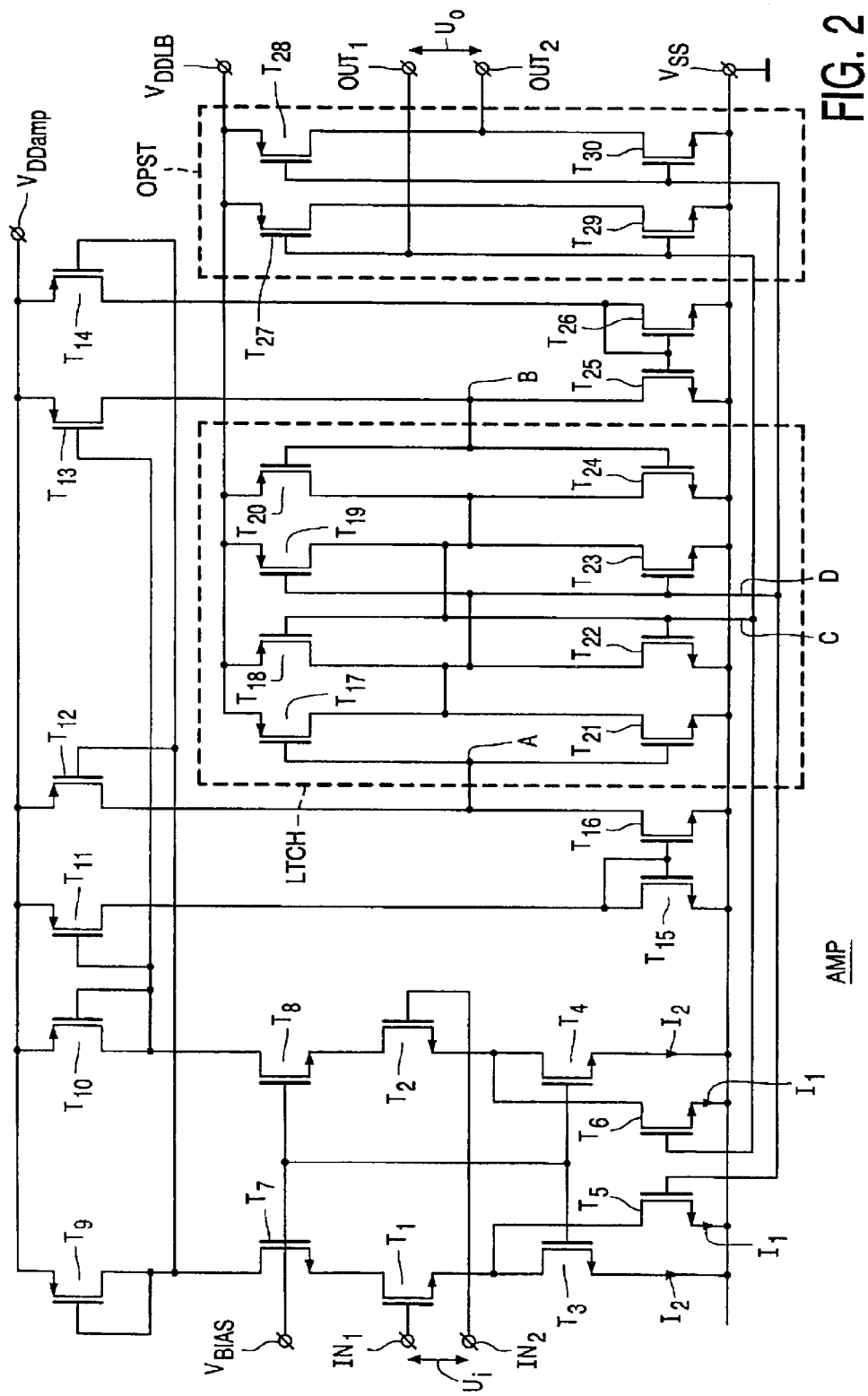

In the drawings:

FIG. 1 is a schematic diagram of an electronic circuit comprising an amplifier in accordance with the invention, which serves as a signal receiving circuit for an oscillator; and FIG. 2 is a detailed electrical circuit diagram of an example of an electronic circuit comprising an amplifier in accordance with the invention.

In these Figures, like reference numerals refer to like parts or elements.

FIG. 1 shows a schematic diagram of an electronic circuit comprising an amplifier AMP that serves as a signal receiving circuit for an oscillator OSC. Said oscillator OSC provides an input signal $U_i$ of limited voltage range to the amplifier AMP, which amplifies this input voltage $U_i$ to an output voltage $U_o$. As it must be possible for the voltage range of the output voltage $U_o$ to be larger than the input voltage $U_i$, a higher voltage can be applied to the supply terminal $V_{DDamp}$ of the amplifier AMP than to the supply terminal $V_{DDosc}$ of the oscillator OSC. To preclude undesirable effects that may be caused by supply voltage variations on the supply terminal $V_{DDamp}$, the supply terminal $V_{DDosc}$ can be coupled to the terminal $V_{BIAS}$. The terminal $V_{BIAS}$ can also be obtained, however, from a different "clean" reference voltage. The input voltage $U_i$ and the output voltage $U_o$ are indicated as differential voltages in FIG. 1. It is alternatively possible, however, that the oscillator OSC is coupled with only one output to only one input of the amplifier AMP, in which case the voltage $U_i$ is referred to the supply terminal $V_{SS}$. Likewise, it is possible that the amplifier AMP has only one output terminal, in which case the voltage $U_o$ is referred to the supply output terminal $V_{SS}$.

FIG. 2 shows an electrical circuit diagram of an electronic circuit with an amplifier AMP in accordance with the invention. In this example, a differential input voltage $U_i$ between the input terminals $IN_1$ and $IN_2$ is amplified to a differential output voltage $U_o$ between the output terminals $OUT_1$ and $OUT_2$. The amplifier AMP comprises an input stage implemented with input transistors $T_1$ and $T_2$ that are connected with their gate to, respectively, input terminal $IN_1$ and $IN_2$; current means comprising current bias transistors $T_5$ and $T_6$ and further current bias transistors $T_3$ and $T_4$; a latch LTCH with inputs A and B and outputs C and D and comprising transistors $T_{17}$ through $T_{24}$; an output stage OPST with inputs connected to the outputs C and D, respectively, of the latch LTCH, and with outputs connected to the output terminals $OUT_1$ and $OUT_2$, which output stage comprises transistors $T_{27}$ through $T_{30}$. The latch LTCH and the output stage OPST are coupled between the supply terminals $V_{DDLB}$ and $V_{SS}$. The remaining part of the circuit is fed from the supply terminals $V_{DDAMP}$ and $V_{SS}$. However, the gates of bias transistors $T_7$ and $T_8$ are connected, preferably via the terminal $V_{BIAS}$, with the supply voltage of the driving circuit, such as an oscillator OSC in FIG. 1. The amplifier AMP also comprises a number of current mirror circuits which are embodied so as to comprise transistors $T_9$ through $T_{16}$ and $T_{25}$ and $T_{26}$. The current bias transistors $T_5$ and $T_6$ are arranged in series via a drain-source path with the input transistors $T_1$ and $T_2$, respectively, and are connected with a gate to, respectively, the outputs D and C of the latch LTCH. The other current bias transistors $T_3$ and $T_4$ are connected in parallel via a drain-source path with the drain-source paths of the current bias transistors $T_5$ and $T_6$, and are connected with a gate to the gates of bias transistors $T_7$ and $T_8$.

Next, a description is given of the operation of the circuit. As, in principle, the circuit also functions without the further current bias transistors $T_3$ and $T_4$, said current bias transistors $T_3$ and $T_4$ are initially left out of consideration. First, the stable state is considered in which the input voltage $U_i$ is logic high, i.e. the potential on the input terminal $IN_1$ is positive in relation to the potential on the input terminal $IN_2$. As a result, the input transistor $T_2$ is not in the conducting state, so that transistors $T_8$, $T_{10}$, $T_{11}$, $T_{13}$, $T_{15}$ and $T_{16}$ are not in the conducting state either. As a result, the potential on the input A of the latch LTCH is logic high, so that the output D is logic low. As a result, the potential on the gate of adjusting transistor $T_5$, which is connected to the output D, is low. Consequently, the adjusting transistor $T_5$ is not in the conducting state. By virtue thereof, no current flows through the input transistor $T_1$, in spite of the fact that the input transistor $T_1$ is in the conducting state. Thus, during the stable state in which the input voltage $U_i$ is logic high, no current flows through the two input transistors $T_1$ and $T_2$. As the output D of the latch LTCH is logic low, the output C is logic high. As a result, the adjusting transistor $T_6$ is, in principle, in th conducting state. However, as the input transistor $T_2$ is non-conducting, no current can flow through the adjusting transistor $T_6$ and hence its drain-source voltage is low.

The transition phase where reversal of the polarity of input voltage $U_i$ takes place is taken into consideration hereinbelow. The input transistor $T_1$ now becomes non-conducting, while the input transistor $T_2$ becomes conducting. Consequently, the drain-source voltage of the adjusting transistor $T_6$ increases, as a result of which it starts carrying current immediately, since the adjusting transistor $T_6$ was ready, as it were, to become conducting owing to the fact that its gate-source voltage was high already. As a result, the quickness of reaction of the circuit is comparatively high, while the (analog) input stage only consumes current during the transition phase. This can be attributed to the fact that, after some time, the potentials on the outputs C and D of latch LTCH alternate, i.e. the potential on output C becomes logic low and the potential on output D becomes logic high. As a result, adjusting transistor $T_6$ does not become conducting, so that the input transistor $T_2$ does not start carrying current, in spite of the fact that it is in the conducting state. Although adjusting transistor $T_5$ is in the conducting state now, it does not carry current because the input transistor $T_1$ is not in the conducting state. Thus, adjusting transistor $T_5$ is ready to rapidly start carrying current when the polarity of the input voltage $U_i$ changes again. The current intensity of the current flowing during the transition phase through the input transistor $T_1$ or through the input transistor $T_2$ is referred to as the first current intensity $I_1$. Outside the transition phase, the current intensity of the current through the input transistor $T_1$ and $T_2$ is referred to as the second current intensity $I_2$, which is zero in the absence of the further current bias transistors $T_3$ and $T_4$.

In order to further increase the quickness of reaction of the circuit, the further current bias transistors $T_3$ and $T_4$ are provided which supply a continuous current having a second current intensity $I_2$ that is comparatively small in relation to the first current intensity $I_1$. In their stable state, the current through the input transistor $T_1$ or $T_2$ is equal to the second current intensity $I_2$. In fact, in this case the "first current intensity" through the input transistor $T_1$ or $T_2$ during the transition phase is not equal to the first current intensity $I_1$ but to the sum of the first current intensity $I_1$ and the second current intensity $I_2$. This sum, however, is approximately equal to the value of the first current intensity $I_1$.

In principle, the outputs C and D of the latch LTCH can also serve as outputs of the amplifier AMP. In order to be able to drive heavy loads it may be desirable, however, to incorporate an output stage OPST, as is indicated in FIG. 2.

For the electronic circuit use can be made of discrete components, or the electronic circuit can be employed in an integrated circuit. Both field effect transistors and bipolar transistors can be used. Also a combination of field effect transistors and bipolar transistors can be used. It is alternatively possible to replace all P-type transistors by N-type transistors, provided that also all N-type transistors are replaced by P-type transistors.

What is claimed is:

1. An electronic circuit comprising an amplifier (AMP) for amplifying a binary input signal (Ui) comprising an input stage coupled to receive the binary input signal (Ui) comprising current means for providing a current setting of the input stage, characterized in that during a period of time which is approximately equal to the duration of a transition phase from a first binary signal level to a second binary signal level of the binary input signal (Ui), the current means supplies a current having a first current intensity (I1) to the input stage, and that, during the remaining period of time, the current has a second current intensity (I2), which is small in relation to the first current intensity (I1).

2. An electronic circuit comprising an amplifier (AMP) as claimed in claim 1, characterized in that the input stage comprises an input transistor (T1; T2) with a control electrode coupled to receive the binary input signal (Ui) and with a main current path, and in that the current means comprise a current adjusting transistor (T5; T6) for providing the first current intensity (I1) of said current, which current adjusting transistor (T5; T6) comprises a control electrode, and the current means further comprise a main current path arranged in series with the main current path of the input transistor (T1; T2).

3. An electronic circuit comprising an amplifier (AMP) as claimed in claim 1, characterized in that the input stage comprises an input transistor (T1; T2) with a control electrode coupled to receive the binary input signal (Ui) and with a main current path, and in that the current means comprise a current adjusting transistor (T5; T6) with a control electrode and a main current path that is connected in series with the main current path of the input transistor (T1; T2) and the current means comprise a further current adjusting transistor (T3; T4) for continuously supplying a current of said second current intensity (I2), which further current adjusting transistor (T3; T4) includes a main current path that is connected in parallel with the main current path of the current adjusting transistor (T5; T6), said first current intensity (I1) being determined by the sum of the current intensity of the current supplied by the current adjusting transistor (T5; T6) and the current intensity of the current supplied by the further current adjusting transistor (T3; T4), and said second current intensity (I2) being determined by the current intensity of the current supplied by the further current adjusting transistor (T3; T4).

4. An electronic circuit comprising an amplifier (AMP) as claimed in claim 2, characterized in that during the first binary signal level of the input signal (Ui), when the input transistor (T1; T2) is not in the conducting state, the current adjusting transistor (T5; T6) is controlled via its control electrode in a manner such that the current adjusting transistor (T5; T6) is in the conducting state, and the current adjusting transistor (T5; T6) remains in the conducting state during said transition phase from the first binary signal level to the second binary signal level, and during the second binary signal level of the input signal (Ui), when the input transistor (T1; T2) is in the conducting state, the current adjusting transistor (T5; T6) is controlled via its control electrode in a manner such that the current adjusting transistor (T5; T6) is not in the conducting state.

* * * * *